United States Patent [19]

Cox

[11] Patent Number: 4,811,424

[45] Date of Patent: Mar. 7, 1989

[54] RAPID PHASE CORRECTING CARRIER RECOVERY CIRCUIT

[75] Inventor: Donald C. Cox, Tinton Falls, N.J.

[73] Assignee: Bell Communications Research, Inc., Livingston, N.J.

[21] Appl. No.: 42,288

[22] Filed: Apr. 24, 1987

[51] Int. Cl.⁴ .................. H04B 1/10; H03D 3/24; H03D 3/18

[52] U.S. Cl. .................. 455/260; 455/264; 455/265; 455/313; 375/120; 329/50

[58] Field of Search ............. 455/260, 313, 314, 316, 455/318, 264, 265, 183, 184; 375/120, 97; 332/19; 329/50; 331/22, 31

[56] References Cited

U.S. PATENT DOCUMENTS

| | | | |
|---|---|---|---|
| 3,544,717 | 10/1967 | Smith | 178/69.5 |
| 3,546,588 | 12/1970 | Campbell, Jr. | 325/42 |
| 3,860,867 | 1/1975 | Johnson | 324/83 |
| 4,348,772 | 9/1982 | Leland et al. | 455/260 |
| 4,355,413 | 10/1982 | Sato | 455/260 |
| 4,365,349 | 12/1982 | Ogita et al. | 455/260 |
| 4,447,792 | 5/1984 | Wynn | 332/19 |
| 4,521,744 | 6/1985 | Yamada et al. | 455/260 |
| 4,569,064 | 2/1986 | Collin et al. | 375/120 |
| 4,639,682 | 1/1987 | Takeuchi | 329/50 |
| 4,652,834 | 3/1987 | McAdam | 329/50 |
| 4,709,406 | 11/1987 | Omoto | 455/260 |
| 4,742,566 | 5/1988 | Nordholt et al. | 455/260 |

FOREIGN PATENT DOCUMENTS 60-111535 6/1985 Japan .................. 455/260
82/03143 9/1982 PCT Int'l Appl. .......... 455/260

Primary Examiner—Robert L. Griffin
Assistant Examiner—Robert E. Smith
Attorney, Agent, or Firm—James W. Falk; Stephen M. Gurey

[57] ABSTRACT

In a circuit that detects from a received RF signal the digital signal modulated on the IF carrier signal by recovering the unmodulated IF carrier signal and comparing the recovered IF carrier with the downconverted RF signal, improvements are presented which minimize errors due to rapid and large phase changes in the RF signal. The circuit includes a downconverter (104) for downconverting the received RF signal to the IF level and a phase-locked loop (115, 118, 116, 119, 117) for both providing correction for relatively slow variations in the RF signal and for deriving the recovered IF carrier signal to which the downconverted IF signal is compared (108). Large and rapid phase changes in the RF signal are detected in a separate loop in the phase locked loop by monitoring (122) the sign and phase of the phase locked loop error signal for signals exceeding a predetermined threshold and rapidly advancing (123) or retarding (124) the phase of the recovered IF carrier whenever the threshold is exceeded.

7 Claims, 3 Drawing Sheets

RAPID PHASE CORRECTING CARRIER RECOVERY CIRCUIT

BACKGROUND OF THE INVENTION

This invention relates to circuits for recovering the carrier signal on which a digital signal has been modulated, and more particularly to circuits which can cope with rapid phase changes in the carrier signal caused by multipath propagation of radio frequency signals.

Radio frequency carrier signals, which are modulated by digital information signals for transmission to digital portable radio receivers, are subject to rapid phase changes due to the multipath propagation environment in which these systems operate. The multipath environment is created by signal reflections at walls and other interfering objects that cause these rapid phase changes as the portable set is moved therethrough. In particular, these phase changes consist of approximately 180 degree transitions which occur approximately every one-half wavelength of motion through the environment and occur at local amplitude minima in the random amplitude distribution.

In order to detect the modulating digital signal properly, a carrier recovery circuit recovers the frequency and phase of the carrier signal from which the digital modulating signal has been stripped. Conventionally, a phase locked loop (PLL) in carrier recovery circuits maintains a frequency and phase lock between the received signal and the recovered carrier. In order, however, to track rapid 180 degree step-like phase changes, the phase locked loop closed loop bandwidth would be required to be many times the signal variation rate (Doppler spectrum width) caused by motion through the environment since step changes in signal phase require impulsive changes in the voltage controlled oscillator (VCO) within the PLL. Therefore, rapid phase changes require extremely large and sharp VCO frequency changes, i.e., the PLL closed loop bandwidth must be wide. Disadvantageously, such a wide PLL closed loop bandwidth results in noisy carrier recovery during the periods of low signal level which is when these large phase changes occur. Furthermore, during these periods of low signal level, the PLL may loose lock as it attempts to track a rapid phase change by changing the VCO frequency too far from the average signal frequency. As a result, phase locked loop reacquisition may be delayed excessively and may not even occur when the signal amplitude reaches a normal level.

SUMMARY OF THE INVENTION

The carrier recovery circuit of the present invention responds to rapid phase changes by incorporating a phase locked loop that advantageously has a narrow closed loop bandwidth. As a result, the error performance of the bit recovery circuitry is unaffected by phase noise on the recovered carrier signal.

The carrier recovery circuit of the present invention includes conventional circuitry for down-converting the digitally modulated radio frequency carrier to an intermediate frequency carrier and for removing the modulating signal therefrom. A phase locked loop detects phase and frequency variations in the input signal from other than and at a lower rate than the digital modulating signal. A phase locked loop error signal is developed for controlling the voltage controlled oscillator within the loop from which a RF signal is generated for offsetting these variations in the input signal. In addition, a signal "in phase" with the intermediate frequency carrier is generated for stripping the carrier from the modulated signal to detect the digital signal. In order to avoid errors in the detected digital signal, which would otherwise result when large and abrupt phase shifts occur in the input signal and the phase locked loop is unable to quickly compensate for these changes, circuitry is included which is responsive to such changes and which can quickly correct for them. In particular, and, in accordance with the present invention, these large and abrupt phase shifts are corrected within a separate loop within the phase locked loop so that the "in phase" signal remains in phase with the actual IF signal. By monitoring the sign and magnitude of the phase locked loop error signal for signals exceeding a predetermined threshold, an instantaneous advancement or retardation of the phase locked loop feedback signal is effected and, simultaneously therewith, a concomitant phase advancement or retardation of the "in phase" signal used to detect the transmitted digital signal. Rapid and large phase changes in the received signal are therefore corrected by a sequence of such rapid phase corrections until the magnitude of the phase locked loop error signal falls below the threshold.

DETAILED DESCRIPTION

Figure 1:
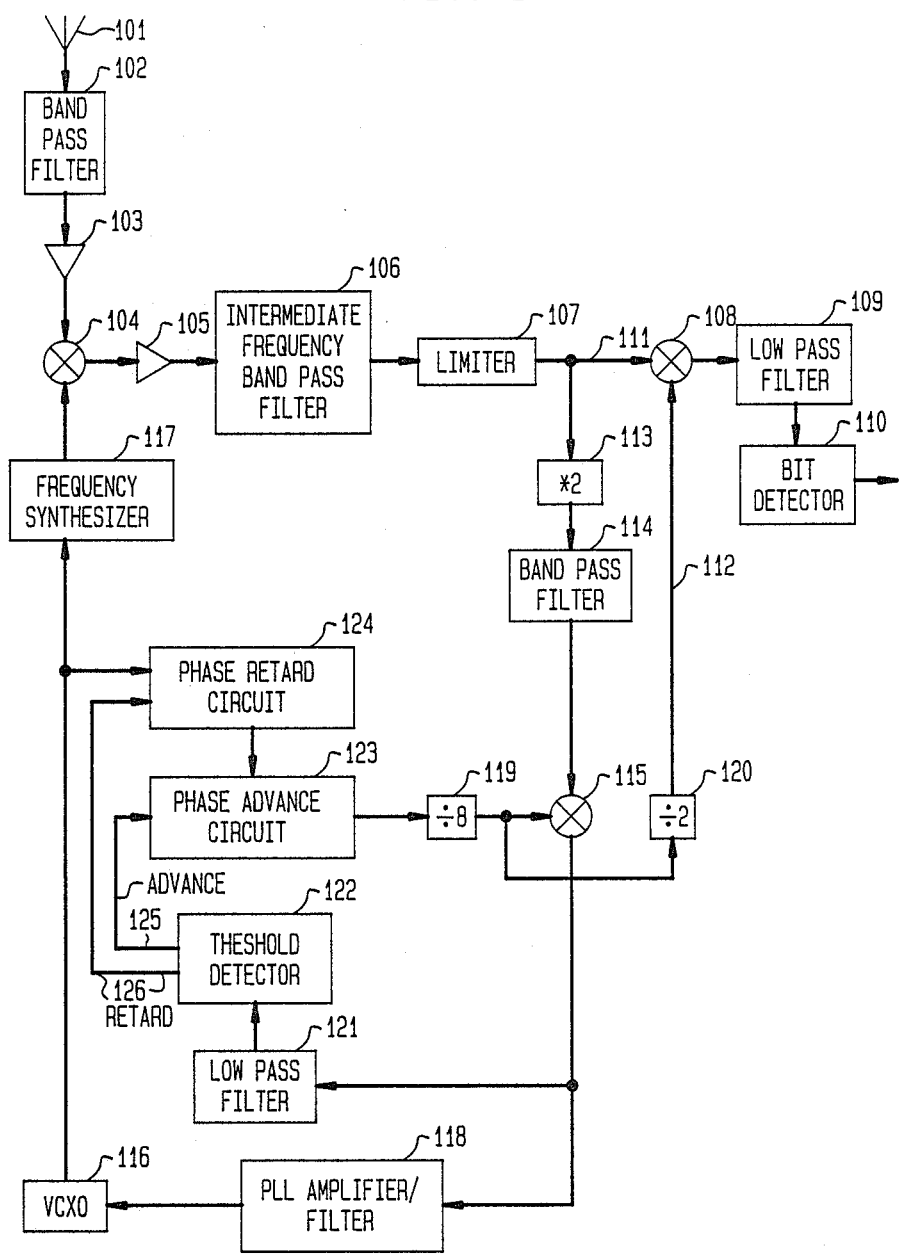
FIG. 1 is a schematic diagram of the carrier recovery circuit of the present invention.

With reference to FIG. 1, antenna 101, band pass filter 102, and amplifier 103 constitute the radio front end of a conventional super heterodyne phase modulation receiver. The received signal consists of a radio frequency (RF) carrier having a frequency typically between hundreds of Mhz and a few Gz. This RF signal is a frequency up-converted intermediate frequency (IF) signal upon Which the binary ONEs and ZEROs of the transmitted digital signal have been modulated. In particular, in this embodiment, the digital signal modulates the IF signal by means of two level phase shift keying modulation.

Filter 102 rejects interfering signals at frequencies other than the RF carrier frequency and amplifier 103 amplifies the filtered signal for input to a mixer/downconverter 104. Mixer/downconverter 104 converts the RF input signal to the IF signal using conventional techniques and input from a locally generated RF oscillator signal, to be described hereinafter. Amplifier 105 amplifies the intermediate frequency signal and intermediate frequency bandpass filter 106 further limits the noise bandwidth and rejects signals other than the IF modulated signal. Limiter 107 clips the filtered IF signal to a constant signal level output. Together, amplifier 105, filter 106, and limiter 107 are parts of a conventional syperheterodyne receiver. As aforenoted, the output of limiter 107 is a constant signal level IF carrier signal upon which the digital information two-level phase signal is modulated, i.e. ZEROs at a 0 degree phase angle and ONEs at a 180 degree phase angle.

The modulating digital bit stream is recovered using conventional coherent phase detection circuitry comprising a coherent phase detector 108, a low pass filter 109 and a bit detector 110. Phase detector 108 compares the phase modulated IF signal on lead 111 with the recovered unmodulated IF carrier signal on lead 112 to determine the phase to the IF signal on lead 111 and thus the transmitted bits. When filtered by low pass filter 109, the resultant signal is a continuous voltage waveform representing the varying ONEs and ZEROs in the bit stream. Bit detector 110, contains the necessary conventional bit timing recovery and threshold circuits to deliver to its output the sharply defined detected bit stream.

Frequency multiplier 113 multiplies the frequency and phase of the two-level constant amplitude IF carrier signal at the output of limiter 107 by a factor of two thereby converting the 180 degree phase transitions to 360 degree transitions, equal to 0 degrees, and thus removing the phase modulation. If four level modulation was employed, frequency multiplier 113 would multiply by a factor of four to remove the modulatory phase information. Band pass filter 114 removes any spurious signals from the signal at the output of multiplier 113.

Phase detector 115, which is a standard multiplier, serves as the phase detector for the carrier recovery PLL to detect changes in the phase of the input signal from other than the modulating digital signal and that are at a lower rate than changes due to the same phase modulation. The phase locked loop consists of a voltage controlled oscillator (VCXO) 116, a frequency synthesizer 117, a PLL amplifier/filter 118, and frequency divider 119, to be discussed hereinafter. The PLL error signal output of phase detector 115 is slowly varying with respect to the carrier frequency. PLL amplifier/loop filter 118 amplifies and integrates this PLL error signal, and the output signal therefrom is applied to VCXO 116. The output of oscillator 116 is applied to frequency synthesizer 117 which multiplies and offsets the frequency of VCXO 116 and inputs the synthesized first local oscillator frequency (LO) at the input of mixer/downconverter 104. This same VCXO signal, which has a frequency eight times greater than the IF frequency, is also fed back through frequency divider 119 (factor of eight) to the loop phase detector 115. Although the VCXO 116 also provides the phase reference for phase detector 115 through frequency divider 119, the largest fraction for phase change for phase tracking control in the PLL is provided through the synthesized first local oscillator at the output of frequency synthesizer 117. This occurs because the phase change at the output of VCXO 116 is multiplied by a large factor for the first local oscillator but is divided by a small factor for the reference for phase detector 115. Thus, any phase change from VCXO 116 is relatively insignificant at phase detector 115 as compared with the resulting phase change at mixer/downconverter 104.

The carrier recovery PLL has a narrow closed loop bandwidth that is only sufficient for tracking the small short term frequency and phase fluctuations of the oscillators and propagation medium. The bandwidth is not large enough, however, to track the nearly 180 degree rapid phase changes resulting from the aforedescribed multipath propagation. As aforenoted, these rapid 180 degree phase shifts which are slower than the modulation rate but faster than that which the phase locked loop can correct, will create excessive phase errors at the output of the voltage controlled oscillator resulting in poor error performance at the output of phase detector 108. The output of phase detector 108 is, as aforenoted, determined by comparing the phase modulated IF signal on lead 111 with the recovered unmodulated carrier signal on lead 112. This unmodulated carrier signal is the output of frequency divider 119 (factor of eight) further divided in frequency by a factor of two by frequency divider 120 to set the frequency of the recovered unmodulated carrier signal to the same IF frequency as the output of limiter 107. Without the correction loop, which will be described in detail hereinafter, a large 180 degree change in the phase of the carrier signal at the input to phase detector 108 on lead 111 would not be immediately compensated for by a "too slow" phase locked loop and would result in the recovered carrier signal being out of phase with the modulated IF carrier signal, thereby causing bit errors at the output of bit detector 110.

In order to prevent errors caused by such rapid 180 degree phase shifts, the carrier recovery circuit includes a rapid phase correction loop consisting of low pass filter 121, threshold detector 122, phase advance circuit 123 and phase retard circuit 124. The low pass filter 121 is designed in a well-known manner to have a bandwidth considerably greater than the closed loop bandwidth of the heretofore discussed phase locked loop. The combined bandwidth of low pass filter 121 and band pass filter 114 are designed to be at least 10 times and possibly 100 times the closed loop bandwidth of the phase locked loop. Rapid changes of the error voltage at the output of phase detector 115, which is representative of the phase difference between the recovered unmodulated carrier and the IF signal, will thus be ensured to occur at the input of threshold detector 122 well before the phase locked loop has time to respond.

When the output of low pass filter 121 exceeds a value indicating a phase change of 22.5 degrees for biphase modulation (180/8), threshold detector 122 generates a pulse indicating whether a rapid phase advancement or rapid phase retardation is needed to correct for the rapid change in the phase of the received signal. Such a pulse on ADVANCE lead 125 or RETARD lead 126 is inputted to phase advance circuit 123 or phase retard circuit 124, respectively, which circuit, in turn, effects an instantaneous phase step advancement or retardation of 22.5 degrees in the output of frequency divider 119. This step phase correction immediately reduces the phase error between the recovered carrier and the IF signal and reduces the error signal at the output of detector 115. Advantageously, threshold detector 122 filters those smaller noise fluctuations that would be associated with the more rapid response of low pass filter 121 as compared to amplifier/filter 118.

Figure 3:
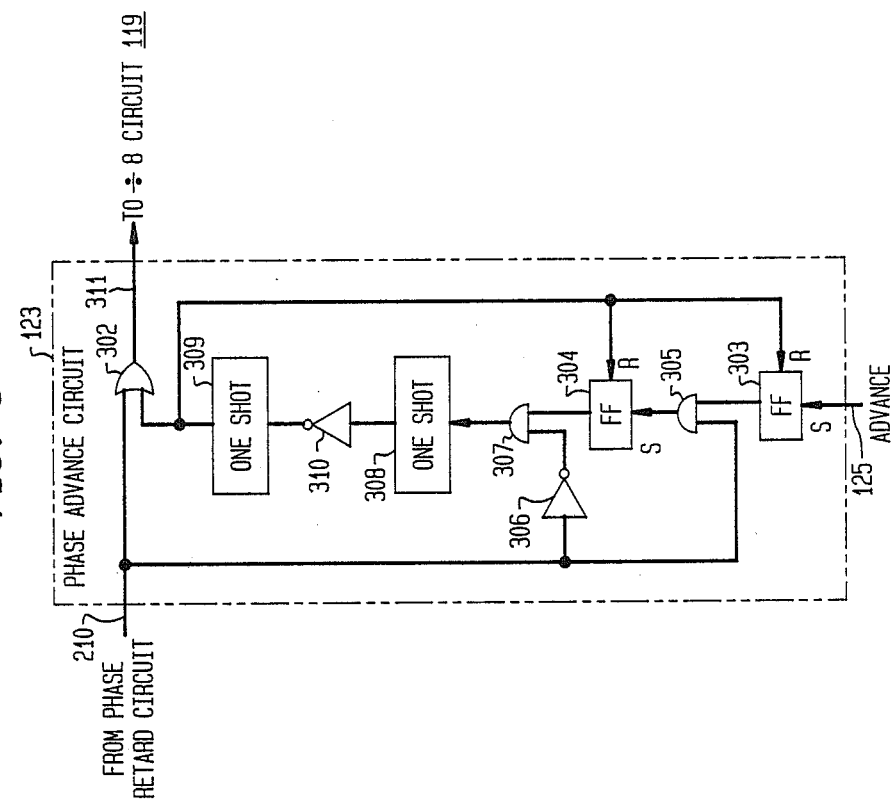
FIG. 3 is a schematic diagram of the phase advance circuit in FIG. 1.
Figure 2:
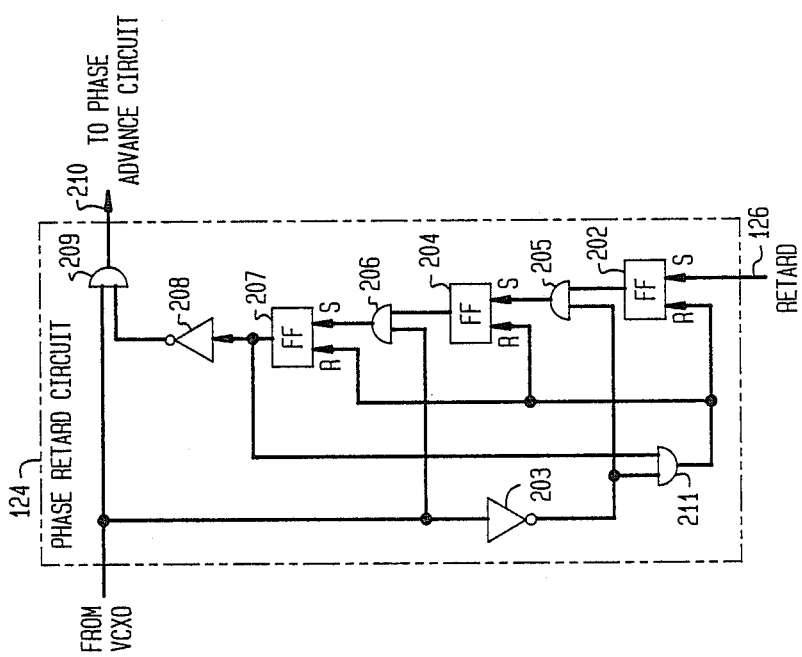
FIG. 2 is a schematic diagram of the phase retard circuit in FIG. 1.

Phase retard circuit 124, which is shown in FIG. 2 and will be described in detail hereinafter, retards by 22.5 degrees the phase of the recovered IF carrier on lead 112 in response to a pulse on RETARD lead 126. Similarly, in response to a pulse on ADVANCE lead 125, phase advance circuit 123, which is shown in FIG. 3 and will be described in detail hereinafter, advances by 22.5 degrees the phase of the recovered IF carrier.

Phase retard circuit 124 in FIG. 2 will be described in conjunction with the timing diagrams in FIG. 4 and phase advance circuit 123 in FIG. 3 will be described in conjunction with the timing diagrams in FIG. 5. Similar numerical designations are given to common elements in FIGS. 1, 2, and 3.

Figure 4:
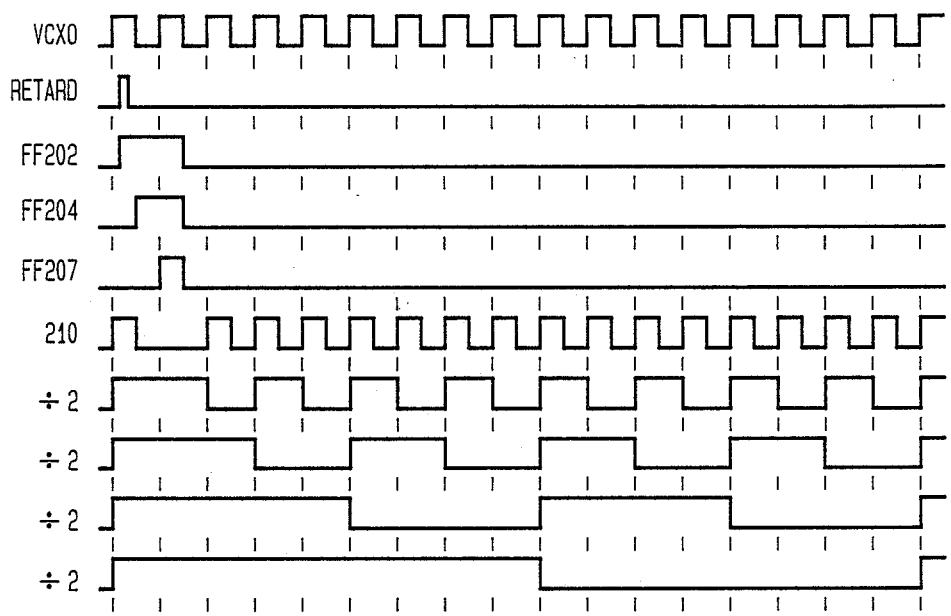
FIG. 4 shows timing diagrams useful in explaining the operation of FIGS. 1 and 2.
Figure 5:
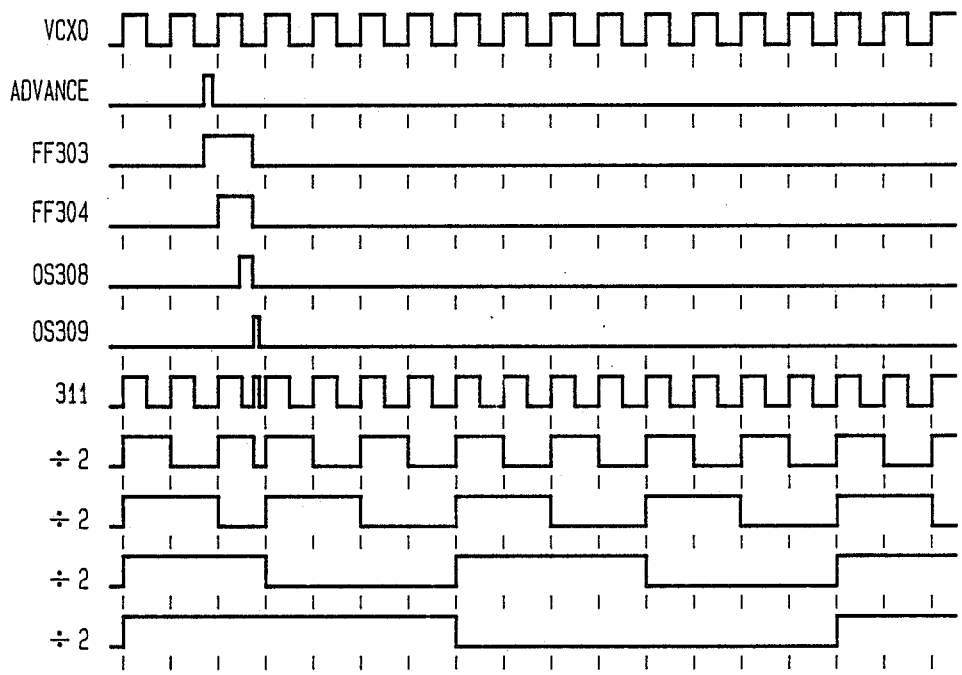
FIG. 5 shows timing diagrams useful in explaining the operation of FIGS. 1 and 3.

With reference now to FIGS. 2 and 4, flip-flop 202 is set in response to a pulse on RETARD lead 126 (see "Retard" and "FF202" timing lines in FIG. 4). If at this time the VCXO input is in a binary ZERO interval, then this ZERO is inverted through inverter 203 and flip-flop 204 is also set through AND gate 205. If the VCXO input is in binary ONE interval when flip-flop 202 is set, then flip-flop 204 is set upon the next ZERO interval of the VCXO input, as can be noted in the "VCXO" and "FF204" timing lines of FIG. 4. A subsequent ONE from the VCXO input when combined with the ONE at the output of flip-flop 204 by AND gate 206 sets flip-flop 207 (see "FF207" timing line). The resultant ONE output of flip-flop 207, when inverted by inverter 208, inhibits the passage through AND gate 209 of that one binary ONE pulse from the VCXO to the output on lead 210 (see "210" timing line). That VCXO output on lead 210 is passed through OR gate 302 in phase advance circuit 123 (in FIG. 3) to the divide-by-eight frequency divider 119 (in FIG. 1). The next binary ZERO from the VCXO is inverted by inverter 203 and combined by AND gate 211 with the set output of flip-flop 207 to produce a reset pulse of AND, which resets flip-flops 202, 204 and 207 (see "VCXO", "FF202, "FF204" and "FF207" timing lines). The succeeding VCXO pulses are then passed through AND gate 209 until another RETARD pulse from threshold detector 122 again sets flip-flop 202. The four successive "÷2" timing lines in FIG. 4 illustrate the effect of the deleted VCXO pulse when divided in frequency by divide-by-eight frequency divider 119 and divide-by-two frequency divider 120. As can be noted in the last "÷2" timing line in FIG. 4, inhibiting one VCXO pulse retards the recovered IF signal at the output of divide-by-two frequency divider 120, and thus at the input to phase detector 108, by 360 degrees/16, or 22.5 degrees. Similarly, VCXO output phase correction also appears at phase detector 115 in the carrier recovery loop.

A 22.5 degree rapid phase retardation in the received signal is thus rapidly corrected without significantly affecting the narrow bandwidth phase locked loop or the VCXO frequency. A rapid phase change in the received signal will be rapidly corrected by a sequence of rapid retardation. Thus, a rapid 180 degree phase change is corrected by a sequence of eight rapid retardations.

Phase advance circuit 123, which, as noted in FIG. 1, is interconnected between phase retard circuit 124 and frequency divider 119, is shown in detail in FIG. 3. FIG. 3 will be described in conjunction with the timing diagrams in FIG. 5. In the absence of a retard pulse to phase retard circuit 124, the VCXO pulses are passed on lead 210 to phase advance circuit 123. In response to a pulse on ADVANCE lead 125, flip-flop 303 is set (see "Advance" and "FF303" timing lines). If the input signal from VCXO 116 on lead 210 is in a binary ONE state, flip-flop 304 is also set through AND gate 305. If not in the ONE state, then flip-flop 304 is set upon the next binary ONE interval of the VCXO signal, as can be noted from the "VCXO" and "FF304" timing lines. The subsequent binary ZERO in the VCXO signal when inverted by inverter 306 and combined with the set output of flip-flop 304 by AND gate 307 triggers a one shot monostable multivibrator 308. As can be noted in the "OS308" timing line in FIG. 5, one shot 308 produces an output pulse of approximately one half of the duration of a VCXO binary ZERO. At the end of the one shot 308 output pulse, one shot monostable multivibrator 309 is triggered through inverter 310. The output pulse of one shot 309 is approximately one fourth the period of a VCXO binary ZERO. This output pulse, as noted in the "OS309" timing line, is combined with the VCXO input on lead 210 by OR gate 302, to produce a signal on lead 311 that has an inserted extra short pulse. This extra cycle in the input to frequency divider 119, noted on the "311" timing line, translates, when successively divided by two four times, into a rapid advancement of 360/16 or 22.5 degrees, as noted in the last "÷2" timing diagram in FIG. 5. A rapid phase change in the received signal of 180 degrees will then be rapidly corrected by a sequence of eight rapid advances as first described.

The output pulse from one shot 309 also resets flip-flops 303 and 304 to set up the circuit for another cycle.

As a numerical example, a portable radio link may operate at a radio frequency around 1 GHz and may use 200 kilobits/second binary PSK modulation. For such a radio link, the IF bandpass filter 106 could have a bandwidth of approximately 300 KHz. Band pass filter 114 could be a two pole filter with a bandwidth of about 30 KHz. For typical crystal oscillators and portable radio propagation, the phase locked loop closed bandwidth could be on the order of 100 Hz. The rapid phase correction loop could then have a low pass filter 121 bandwidth of 30 KHz.

The above described embodiment is illustrative of the principles of the present invention. Other embodiments could be devised by those skilled in the art without departing from the spirit and scope of the present invention.

What is claimed is:

1. A circuit for recovering an unmodulated IF carrier signal from a received modulated RF input signal comprising:

downconverter means for downconverting the received RF input signal to an IF frequency signal by mixing the received RF signal with a locally generated signal at the RF frequency;

means for stripping the modulating signal from the downconverted input signal at the IF frequency;

a carrier recovery phase locked loop comprising a local voltage controlled oscillator and phase detection means for generating an error signal from the phase difference between the stripped downconverted input signal and a signal derived from the oscillator, the error signal controlling the frequency of said oscillator;

means for deriving the recovered IF carrier signal from the local oscillator signal; and means for deriving from said oscillator signal the locally generated RF signal, said carrier recovery phase locked loop providing to said downconverter means, through said locally generated RF signal, correction for variations in the RF input signal;

CHARACTERIZED IN THAT said carrier recovery phase locked loop further comprises threshold means connected to said phase detection means for detecting and indicating when changes in the magnitude of the error signal rapidly exceed a predetermined threshold, and rapid phase correcting means connected to said threshold means and said means for deriving the recovered If carrier signal from the oscillator signal, for rapidly positively or negatively incrementing the phase of the recovered If carrier signal, before the error signal can affect the frequency of said oscillator, when said threshold means indicates that said error signal has rapidly exceeded said predetermined threshold.

2. A circuit in accordance with claim 1 wherein said threshold means produces a first output signal when the magnitude of the error signal rapidly positively exceeds said threshold and for producing a second output signal when the magnitude of the error signal rapidly negatively exceeds said threshold and wherein said rapid phase correcting means comprises:

phase retarding means connected to said threshold means for rapidly retarding the phrase of the recovered IF carrier signal when said first output signal is produced by said threshold means; and phase advancing means connected to said threshold means for rapidly advancing the phase of the recovered IF carrier signal when said second output signal is produced by said threshold means.

3. A circuit in accordance with claim 2 wherein said phase retarding means and said phase advancing means are connected between said local oscillator and said means for deriving the recovered IF carrier, said phase retarding means comprising means for removing at least one cycle from the oscillator signal when said second output signal is produced by said threshold means, and said phase advancing means comprises means for adding at least one extra cycle to the oscillator signal when the first output signal is produced by said threshold means.

4. A receiver for detecting from a received RF input signal a digital signal modulated on an IF carrier signal comprising:

downconverter means for downconverting the received RF input signal to an IF frequency signal by mixing the received RF signal with a locally generated signal at the RF frequency;

means for stripping the modulating digital signal from the downconverted input signal at the IF frequency;

a carrier recovery phase locked loop comprising a local voltage controlled oscillator and phase detection means for generating an error signal from phase difference between the stripped donwconverted input signal and a signal derived from the oscillator signal, the error signal controlling the frequency of said oscillator;

means for deriving the recovered IF carrier signal from the local oscillator signal;

means for deriving from the oscillator signal the locally generated RF signal, said carrier recovery phase locked loop providing to said downconverter means, through said locally generated RF signal, correction for variations in the RF input signal;

means for comparing the recovered IF carrier signal with the downconverted input signal at the IF frequency for detecting the digital signal;

said carrier recovery phase locked loop further comprising threshold means connected to said phase detector means for detecting and indicating when changes in the magnitude of the error signal rapidly exceed a predetermined threshold, and rapid phase correcting means connected to said threshold means and said means for deriving the recovered IF carrier signal from the oscillator signal, for rapidly positively or negatively incrementing the phase of the recovered IF carrier signal, before the error signal can affect the frequency of said oscillator, when said threshold means indicates that said error signal has rapidly exceeded said predetermined threshold, wherein the phase of the recovered IF carrier signal is rapidly adjusted in response to rapid and large phase variations in the received RF input signal so as to minimize errors in the detected digital signal.

5. A receiver in accordance with claim 4 wherein said threshold means produces a first output signal when the magnitude of the error signal rapidly positively exceeds said threshold and for producing a second output signal when the magnitude of the error signal rapidly negatively exceeds said threshold and wherein said rapid phase correcting means comprises:

phase retarding means connected to said threshold means for rapidly retarding the phase of the recovered IF carrier signal when said first output signal is produced by said threshold means; and phase advancing means connected to said threshold means for rapidly advancing the phase of the recovered IF carrier signal when said second output signal is produced by said threshold means.

6. A receiver in accordance with claim 5 wherein aid phase retarding means and said phase advancing means are connected between said local oscillator and said means for deriving the recovered IF carrier, said phase retarding means comprising means for removing at least one cycle from the oscillator signal when said second output signal is produced by said threshold means, and said phase advancing means comprises means for adding at least one extra cycle to the oscillator signal when the first output signal is produced by said threshold means.

7. A method for preventing rapid changes in a RF signal from causing errors in detection of the digital signal modulated on the IF signal in a circuit having means for recovering the unmodulated IF signal from the received RF signal, means for downconverting the received RF signal to a signal at the IF frequency, means for deriving a phase locked loop error signal from the phase difference between the downconverted IF frequency signal and a local oscillator signal, and means for providing corrections to said downconverting means for variations in the RF signal, said method comprising the steps of monitoring the sing and magnitude of the phase locked loop error signal for signals rapidly exceeding a predetermined threshold, and rapidly advancing or retarding the phase of the recovered unmodulated IF signal responsive to said monitoring step before the error signal can affect the frequency of the oscillator.

* * * * *